United States Patent
Wieczorek et al.

(10) Patent No.: US 6,207,563 B1
(45) Date of Patent: Mar. 27, 2001

(54) LOW-LEAKAGE COSI$_2$-PROCESSING BY HIGH TEMPERATURE THERMAL PROCESSING

(75) Inventors: Karsten Wieczorek, Boxdorf; Manfred Horstmann, Dresden, both of (DE); Frederick N. Hause, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/245,815

(22) Filed: Feb. 5, 1999

(51) Int. Cl.$^7$ .................................................. H01L 21/44
(52) U.S. Cl. ............................................ 438/664; 438/660
(58) Field of Search ................................. 438/655, 683, 438/686, 4, 293, 660, 661, 664

(56) References Cited

U.S. PATENT DOCUMENTS

| | | |
|---|---|---|
| 4,994,402 | 2/1991 | Chiu . |
| 5,223,445 | 6/1993 | Fuse . |
| 5,567,651 | 10/1996 | Berti et al. . |
| 5,741,721 | 4/1998 | Stevens . |
| 5,780,361 | 7/1998 | Inoue . |
| 5,780,362 * | 6/1998 | Wang et al. .......................... 438/683 |
| 5,851,891 | 12/1998 | Dawson et al. ....................... 438/305 |
| 5,874,342 | 2/1999 | Tsai et al. ............................ 438/301 |
| 5,902,129 | 5/1999 | Yoshikawa et al. .................. 438/592 |
| 5,937,325 | 8/1999 | Ishida ................................... 438/655 |
| 5,970,370 | 10/1999 | Besser et al. ......................... 438/586 |
| 5,970,379 | 10/1999 | Chen et al. ........................... 438/682 |
| 5,989,988 | 11/1999 | Iinuma et al. . |
| 6,133,124 * | 10/2000 | Horstmann et al. . |

FOREIGN PATENT DOCUMENTS 409162167   6/1997   (JP) .

OTHER PUBLICATIONS

Stanley Wolf and Richard N. Tauber; *Silicon Processing for the VLSI Era*; vol. 2: Process Integration; pp. 150–151; 1990.

* cited by examiner

*Primary Examiner*—Charles Bowers
*Assistant Examiner*—Evan Pert
(74) *Attorney, Agent, or Firm*—Timothy M. Honeycutt

(57) ABSTRACT

Methods of fabricating a silicide layer on a substrate or transistor structures thereon are provided. An exemplary method includes the steps of depositing a layer of metal on a substrate that has a pn junction. The metal layer and the substrate are heated to react the metal with the substrate and form the silicide layer. Any unreacted metal is removed. The substrate and the silicide layer are heated above the agglomeration threshold temperature of any filaments of the silicide layer penetrating the pn junction but below the agglomeration threshold temperature of the silicide layer. The method eliminates silicide filaments, particularly in cobalt silicide processing, that can otherwise penetrate the pn junction of a transistor source/drain region a lead to reverse-bias diode-leakage currents.

39 Claims, 4 Drawing Sheets

LOW-LEAKAGE COSI$_2$-PROCESSING BY HIGH TEMPERATURE THERMAL PROCESSING

BACKGROUND OF THE INVENTION

1. Field of the Invention

This invention relates generally to semiconductor processing, and more particularly, to a method of fabricating a silicide layer on a substrate.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The substrate is annealed to activate the dopant in the source and the drain. Dielectric sidewall spacers are frequently formed adjacent to the gate electrode to serve as implant masks and barriers to hot carriers.

The interfaces between structures of a transistor implemented in silicon or polysilicon, such as source/drain regions and poly gates, and local or global interconnects typically exhibit relatively high series sheet resistances. The resistances can lead to undesirably high power consumption and heat propagation in integrated circuits. One method in use for years to reduce the series resistance of these types of structural interfaces involves the fabrication of metal-silicide layers on sources and drains, and on gate electrodes where polysilicon is the material of choice. Self-aligned silicidation ("salicidation") is perhaps the most common application of this method.

In conventional salicidation, a metal capable of reacting with silicon, such as titanium, is deposited on the gate, the sidewall spacers, and the source and drain regions. A one or two step anneal is performed to react the titanium with the polysilicon of the gate and the silicon of the source and drain regions to form TiSi$_2$. Following the anneal, an etch is performed to remove any unreacted titanium.

In addition to serving as implant masks, one of the principal functions of sidewall spacers is to separate the silicided gate from the source/drain regions. Despite the incorporation of spacers, silicide may form laterally and easily bridge the separation between the polysilicon gate electrode and the silicon source/drain regions causing the gate to become shorted to the source/drain regions. This so-called "bridging effect" occurs where silicon diffuses into the titanium regions that cover the sidewall spacers and subsequently reacts with the titanium.

Certain conditions tend to favor lateral TiSi$_2$ formation. Conventional furnace annealing in an inert gas atmosphere (e.g., argon for approximately 30 minutes) may foster rapid lateral TiSi$_2$ formation. Processing in the sub-0.25 $\mu$m domain also appears to raise the frequency of lateral silicide formation. In sub-0.25 $\mu$m processing, the minimum gate width may approach or even reach the dimensions of the grain boundaries between the individual grains of the polycrystalline silicon gate electrode. As the minimum device size approaches the dimensions of the grain boundaries in the polysilicon, the rate of silicon diffusion from the polysilicon into the titanium increases. The increased diffusivity is believed to stem from the elimination of pluralities of intersecting polysilicon grain boundaries that are present in larger scale processes. These grain boundaries act as natural barriers to silicon diffusion.

Cobalt silicide processing has gained some recognition as a potential replacement for TiSi$_2$ in salicidation processing. Cobalt silicide provides acceptable values of sheet resistance and presents much lower risk of bridging. However, conventional CoSi$_2$ processing is not without disadvantages. Most conventional methods are similar to conventional TiSi$_2$ processing in that a layer of cobalt is deposited on silicon and/or polysilicon and annealed to trigger conversion to cobalt silicide. During the anneal, cobalt and/or cobalt silicide can quickly diffuse down into the substrate and form conducting filaments that penetrate the pn junctions of a source drain region. Depending on their depth, size and number, such filaments can cause unacceptably high reverse-bias diode-leakage currents.

The conventional technique for compensating for cobalt silicide filament formation is to ensure that the pn junctions of source/drain regions are positioned below the deepest anticipated filament penetration. The determination of the maximum anticipated filament depth involves some guess work. Moreover, placing depth constraints on pn junction depth represents a real impediment to transistor geometry scaling.

The present invention is directed to overcoming or reducing the effects of one or more of the foregoing disadvantages.

SUMMARY OF THE INVENTION

In accordance with one aspect of the present invention, a method of fabricating a silicide layer on a substrate that has a pn junction is provided. The method includes the steps of depositing a layer of metal on the substrate and heating the metal layer and the substrate to react the metal with the substrate and form the silicide layer. Any unreacted metal is removed. The substrate and any filaments of the silicide layer penetrating the pn junction are heated above the agglomeration threshold temperature of the filaments but below the agglomeration threshold temperature of the silicide layer.

In accordance with another aspect of the present invention, a method of fabricating a silicide layer on a gate electrode, a first source/drain region and a second source/drain region of a transistor on a substrate is provided. The method includes the steps of depositing a layer of metal on the gate electrode and the first and second source/drain regions. The metal layer, the gate electrode and the first and second source/drain regions are heated to react the metal therewith and form the silicide layer. Any unreacted metal is removed. The substrate and any filaments of the silicide layer penetrating the pn junctions of the first and second source/drain regions are heated above the agglomeration threshold temperature of the filaments but below the agglomeration threshold temperature of the silicide layer.

In accordance with another aspect of the present invention, a method of fabricating a cobalt silicide layer on a substrate is provided that includes the steps of depositing a layer of cobalt-containing material on the substrate and heating the layer of cobalt-containing material and the substrate to react the layer of cobalt-containing material with the substrate and form the cobalt silicide layer. Any unreacted cobalt-containing material is removed. The substrate and any filaments of the cobalt silicide layer penetrating the pn junction are heated above the agglomeration threshold temperature of the filaments but below the agglomeration threshold temperature of the cobalt silicide layer.

In accordance with another aspect of the present invention, a method of fabricating a transistor on a substrate is provided that includes the steps of forming a gate insulating layer on the substrate and forming a gate electrode on the gate insulating layer. A first source/drain region and a second source/drain region are formed in the substrate. A silicide layer is formed on the first and second source/drain regions by depositing a layer of metal on the first and second source/drain regions, heating the metal layer and the substrate to react the metal with the substrate and form the silicide layer, removing any unreacted metal, and heating the substrate and any filaments of the silicide layer penetrating the pn junctions of the first and second source/drain regions above the agglomeration threshold temperature of the filaments but below the agglomeration threshold temperature of the silicide layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
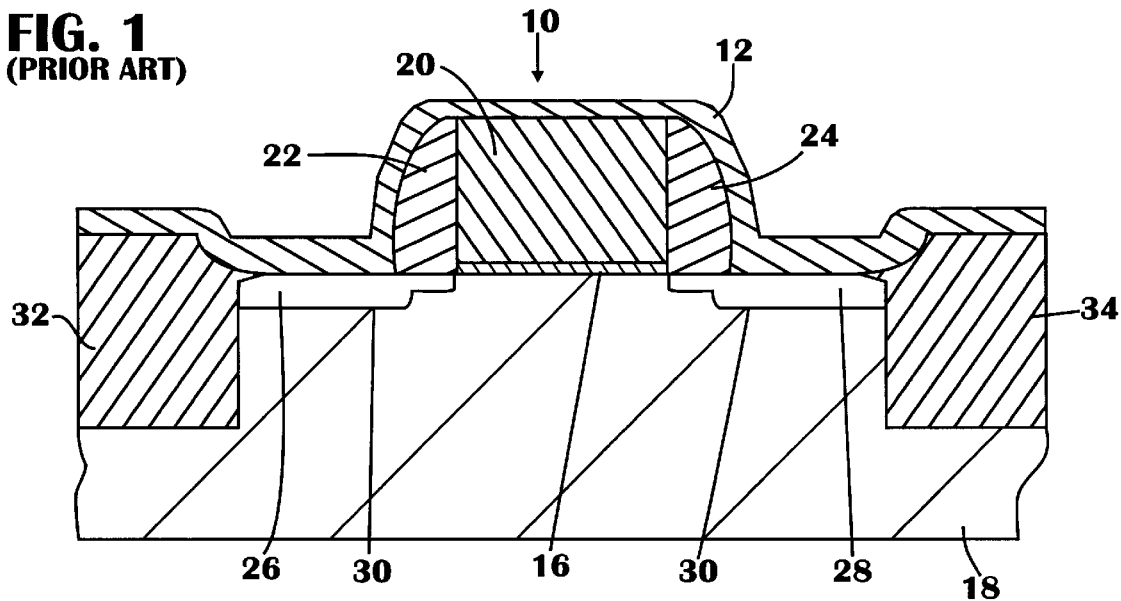
FIG. 1 is a cross-sectional view of an exemplary conventional field effect transistor depicting deposition of a silicide-forming metal layer thereon.
Figure 2:
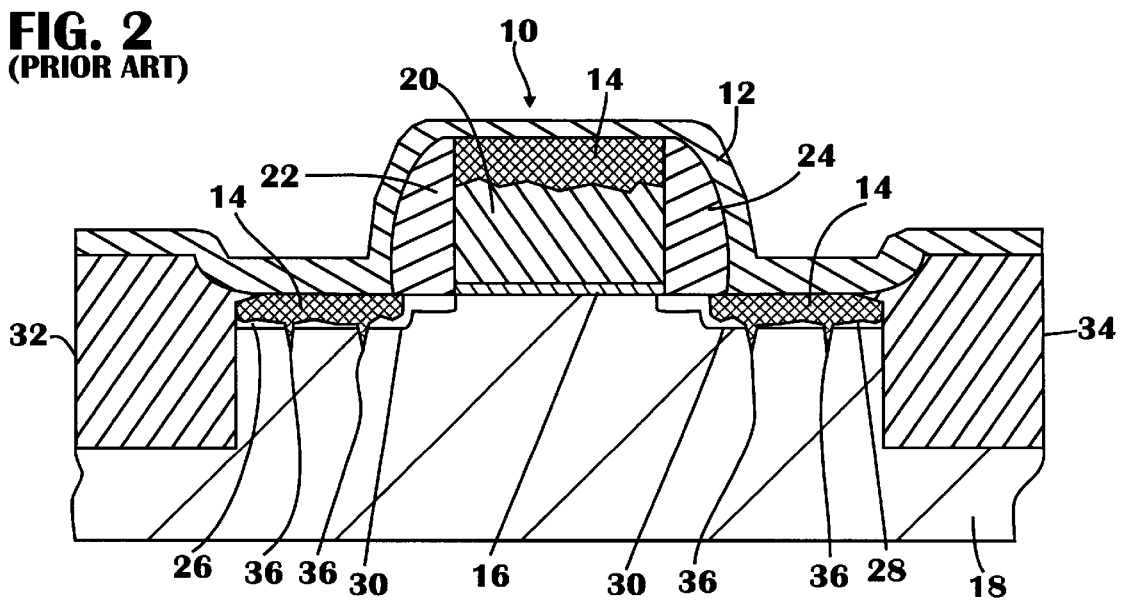
FIG. 2 is a cross-sectional view like FIG. 1 depicting conversion of the metal layer into silicide and removal of any unreacted metal.

In the drawings described below, reference numerals are generally repeated where identical elements appear in more than one figure. FIGS. 1 and 2 are highly magnified cross-sectional views of a conventional field effect transistor 10. FIG. 1 depicts deposition of a cobalt layer 12 on the transistor 10 while FIG. 2 depicts subsequent thermal silicide reaction to establish a cobalt silicide layer 14. The transistor 10 includes a gate dielectric layer 16 fabricated on a semiconductor substrate 18 and a gate electrode 20 is positioned on the gate dielectric layer 16. The gate dielectric layer 16 and the gate 20 are bracketed by a pair of dielectric sidewall spacers 22 and 24. Dual-graded source/drain regions 26 and 28 are formed in the substrate 18. The pn junctions for the source/drain regions 26 and 28 are commonly designated 30. The transistor 10 is electrically isolated from various other structures on the substrate 18 by isolation structures 32 and 34, which are typically field oxide regions or trench isolation structures.

The cobalt layer 12 is blanket deposited on the substrate 18, typically by physical vapor deposition ("PVD") as shown in FIG. 1. The cobalt layer 12 is subsequently annealed to initiate a silicide forming reaction between the cobalt and the underlying silicon substrate 18 and the polysilicon gate electrode 20. The cobalt-silicon reaction is generally consumptive of silicon and polysilicon, thus the silicide layer 14 invades the gate electrode 20 and the source/drain regions 26 and 28 as shown. As a result of the relatively high mobility of cobalt atoms in silicon at the temperatures necessary for the cobalt-silicon reaction, localized filaments 36 of cobalt silicide penetrate the pn junctions 30 of the source/drain regions 26 and 28. If no remedial steps are taken, these cobalt silicide filaments 36 will lead to unacceptably high reverse-bias diode-leakage current levels.

As noted above, the conventional method for avoiding the deleterious effects of the filaments 36 is to position the pn junctions 30 of the source/drain regions 26 and 28 at a depth that is greater than the greatest anticipated penetration of a given filament 36. The obvious downside to this technique is deeper than desired pn junctions 30 for the source/drain regions 26 and 28 and a very significant impediment upon the potential scaling of transistor geometry.

Figure 3:
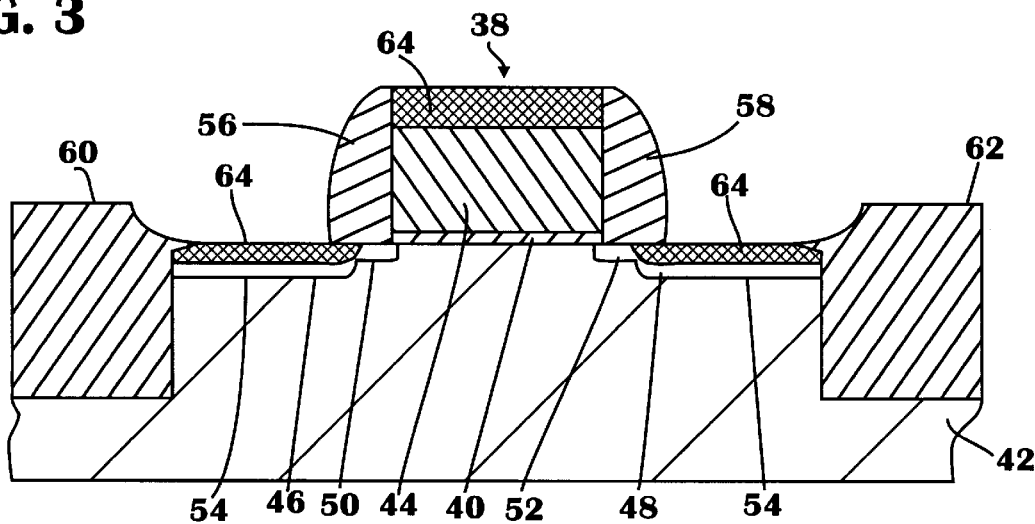
FIG. 3 is a cross-sectional view of an exemplary embodiment of a transistor fabricated in accordance with the present invention.

An exemplary embodiment of an integrated circuit transistor 38 fabricated in accordance with the present invention may be understood by referring now to FIG. 3, which is a highly magnified cross sectional view of the transistor 38. The transistor 38 includes a gate dielectric layer 40 positioned on a semiconductor substrate 42 and a gate electrode 44 positioned on the gate dielectric layer 40. The substrate 42 may be composed of n-doped silicon, p-doped silicon, silicon-on-insulator or other suitable substrate materials. The transistor 38 is provided with source/drain regions 46 and 48 in the substrate 42. The phrase "source/drain region (s)" is used herein to describe a region that may serve as either a source or a drain. The skilled artisan will appreciate that a source/drain region may function as a source or a drain depending upon how it is interconnected with subsequent metallization. The source/drain region 46 is provided with a lightly doped drain ("LDD") structure 50. The source/drain region 48 is provided with a similar LDD structure 52. The pn junctions for the source/drain regions 46 and 48 are collectively designated 54. As used herein, the phrase "pn junction" is intended to mean a junction between a p-type region and an n-type region. The gate dielectric layer 40 and the gate electrode 44 are bracketed by a pair of dielectric sidewall spacers 56 and 58 that may be composed of a variety of commonly used spacer materials, such as, for example, silicon dioxide, silicon nitride or the like.

The transistor 38 is electrically isolated from various other structures on the substrate 42 by isolation structures 60 and 62, which may by discrete structures or portions of a moat-like structure surrounding the transistor 38. The structures 60 and 62 may be field oxide regions, shallow trench isolation structures or the like.

Enhanced ohmic contact between the source/drain regions 46 and 48, the gate electrode 44 and any subsequent metallization may be provided by a silicide layer 64 formed on the source/drain regions 46 and 48 and the gate electrode 44. As described below, the process in accordance with the present invention provides for the fabrication of the siticide layer 64 with elimination of the aforementioned localized filament formation problem, enabling the reliable fabrication of cobalt and other types of silicide layers without sacrificing the ability to establish shallow junctions and scale transistor geometry.

Figure 4:
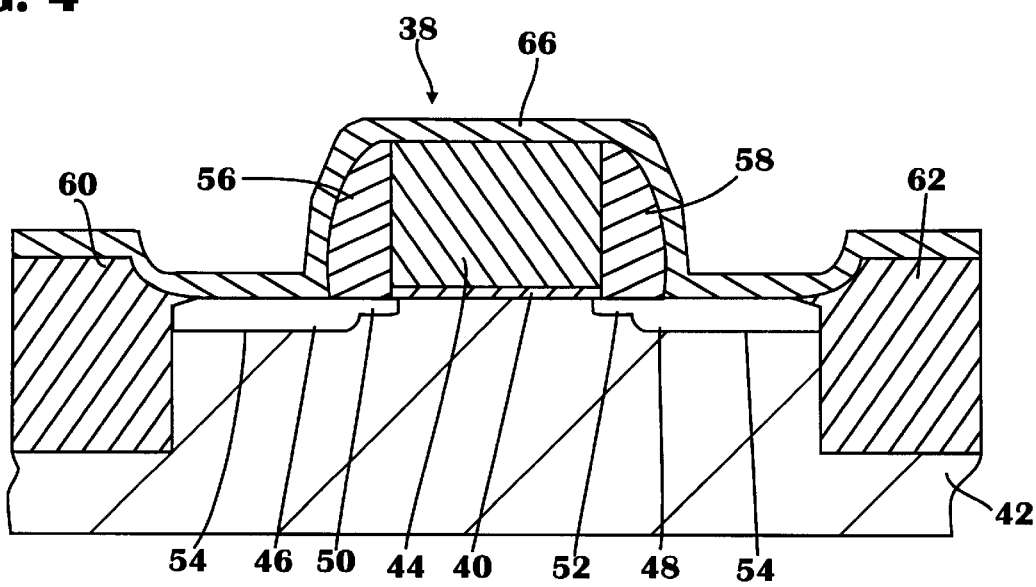
FIG. 4 is a cross-sectional view like FIG. 3 depicting deposition of a metal layer on the transistor in accordance with the present invention.
Figure 5:
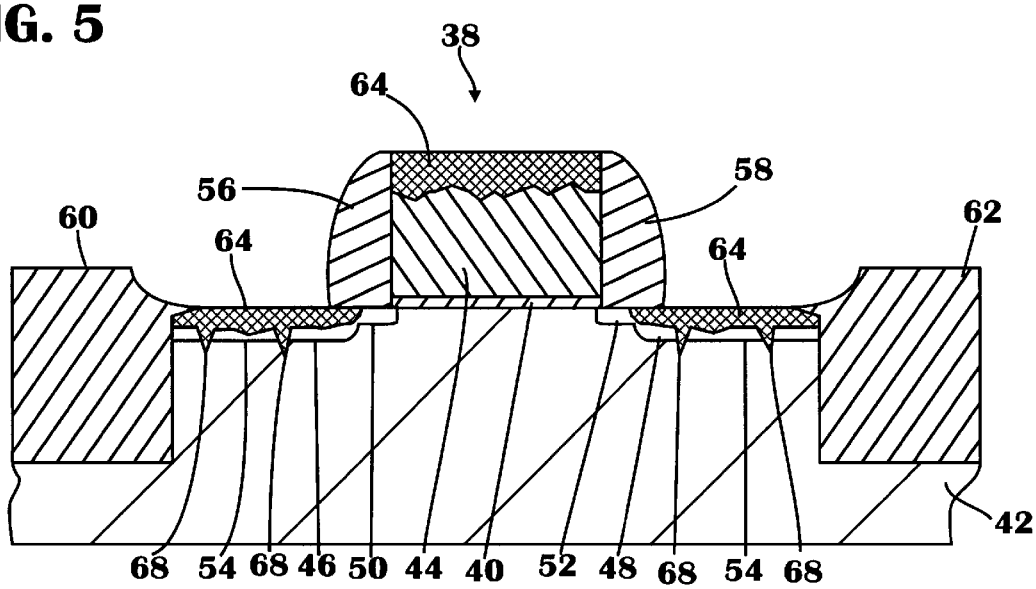
FIG. 5 is a cross-sectional view like FIG. 4 depicting thermal processing of the metal layer to establish a silicide layer and to eliminate any silicide filaments coupled thereto and removal of any unreacted metal in accordance with the present invention.

An exemplary process for fabricating the transistor 38 and the conductor layer 64 shown in FIG. 3 in accordance with the present invention may be understood by referring now to FIGS. 4 and 5. The process flow will be described in the context of an n-channel device. However, the skilled artisan will appreciate that the transistor 38 may be implemented as an n-channel, a p-channel or other types of devices. Initially, the isolation structures 60 and 62 may be established in the substrate 42 using well known conventional methods. The isolation structures 60 and 62 may be shallow trench isolation, field oxide, or other isolation structures. In an exemplary embodiment, the structures 60 and 62 are shallow trench isolation structures and may be composed of silicon dioxide, silicon nitride or other suitable isolation materials, and may be formed using well known damascene etching and fill techniques. As used herein, the phrase "composed of" is not intended to exclude the incorporation of other constituents in a given layer.

The gate insulating or dielectric layer 40 is formed on the substrate 42 by oxidation, blanket CVD or the like. As used herein, the terms "formed on", "disposed on" or "positioned on" should be construed to include the possibility that a given layer or structure may be formed on another given layer or structure with a third or other intervening layers or structures disposed between the two. The layer 40 is advantageously composed of suitable gate dielectric materials, such as, for example, silicon dioxide, silicon nitride, $Ta_2O_5$, laminates of these or the like. In an exemplary embodiment, the layer 40 is composed of silicon dioxide formed by thermal oxidation to a thickness of about 15 to 50 Å. A rapid thermal anneal ("RTA") with an oxygen containing ambient at about 800 to 1050° C. for about 10 to 30 seconds may be used. Optionally, a furnace process may be used for about 10 to 30 minutes.

The gate electrode 44 is fabricated by initially depositing a layer of conducting material on the gate insulating layer 40 and subsequently patterning the layer into the desired shape for the gate 44 by etching. The gate electrode 44 may be composed of a variety of conducting materials, such as, for example, polysilicon, amorphous silicon, aluminum, tantalum or the like. In an exemplary embodiment, the gate electrode 44 is composed of polysilicon. Well known techniques for applying polysilicon, such as CVD, may be used to deposit the gate electrode 44. In an exemplary embodiment, the polysilicon is deposited at or above about 625° C. to a thickness of about 750 to 2000 Å. The etch to pattern the gate electrode 44 may be performed selectively to the gate insulating layer 40 as shown so that the layer 40 may be left in place as a screen oxide against subsequent implants or, alternatively, the etch may be to the substrate 42. Reactive ion etching ("RIE"), chemical plasma etching or the like may be used in conjunction with a variety of etchant species suitable for anisotropically etching polysilicon, such as, for example, $CF_4/O_2$. The width of the gate electrode 44 will typically be the minimum feature size available with the prevailing lithographic patterning system, although larger geometries are possible. Later implants for the sourcedrain regions 46 and 48 will render the gate electrode 44 conductive.

The source\drain regions 46 and 48 may be established by ion implantation or diffusion, and may be single or multi-graded as desired. In the illustrated embodiment, the source/drain regions 46 and 48 are multi-graded and established by ion implantation. Initially, an implant is performed to establish the LDD structures 50 and 52 self aligned to the gate electrode 44. A variety of n-type impurity species may be used, such as, for example, arsenic, phosphorus or the like. In an exemplary embodiment, arsenic may be implanted with an energy of about 5 to 30 keV and a dosage of about 5E14 to 3E15 $cm^{-2}$. The implant may be on or off axis as desired. The relatively low implant energy combined with the screening effect of the insulating layer 40 establishes initially shallow junctions for the LDD structures 50 and 52.

The sidewall spacers 56 and 58 are fabricated in anticipation of an additional source/drain implant. Initially, any remaining exposed portions of the gate insulating layer 40 are anisotropically etched selectively to the substrate 42 by RIE, chemical plasma etching or the like using a species such as $CF_4/H_2$. The spacers 56 and 58 are fabricated by oxidation or blanket deposition of a variety of suitable dielectric sidewall spacer materials, such as, for example, silicon nitride, silicon dioxide, silicon oxynitride or the like. In an exemplary embodiment, the spacers 56 and 58 are composed of silicon nitride and may be fabricated by blanket deposition using low pressure or plasma enhanced CVD to a thickness of about 100 to 1000 Å followed by an anisotropic etch selective to the substrate 42 to yield the completed spacers 56 and 58. Again, the etch may be by RIE, chemical plasma etching, or other suitable anisotropic etching techniques utilizing a chemistry suitable for anisotropically etching silicon nitride, such as $C_3F_8$.

A second implant is performed to complete the source/drain regions 46 and 48 using an n-type dopant specie of the type described above. In an exemplary embodiment, arsenic is implanted with a dosage of about 1E15 to 1E16 $cm^{-2}$ and an energy of about 10 to 40 keV. The implant may again be on or off axis. Activation of the source/drain regions 46 and 48 may be by RTA at about 900 to 1100 degrees for about 10 to 60 seconds.

Next, a metal layer 66 is blanket deposited on the substrate 42. The metal layer 66 may be composed of a cobalt-containing material, such as relatively pure cobalt or cobalt combined with a small amount of another constituent or constituents, such as platinum, gold or the like, or other metallic materials suitable for silicide formation, such as, for example, platinum, palladium, nickel, tungsten, tantalum, molybdenum or the like. In an exemplary embodiment, the layer 66 is composed of relatively pure cobalt and may be deposited by PVD to a thickness of about 50 to 300 Å. If, as is the case with cobalt, the layer 66 is composed of a material that will not readily reduce silicon dioxide, the upper surface of the substrate 42 should be physical sputter etched prior to the PVD step to remove any native oxides. The physical sputter etch may be performed using argon as the sputter species. End point may be derived from etch rate.

The substrate 42 and the metal layer 66 are heated to initiate a silicide-forming reaction. The heating step may be performed at about 400 to 600° C. for about 30 to 120 seconds in an RTA with an inert ambient of argon or nitrogen. This first heating step establishes the silicide layer 64 on the source/drain regions 46 and 48 and the gate electrode 44. As the silicide reaction is consumptive of silicon and polysilicon, the layer 64 partially invades the source/drain regions 46 and 48 and the gate electrode 44 as shown in FIG. 5. Note that this reaction will not occur at the gate 44 where the gate 44 is composed of a material other than polysilicon. For the purpose of illustration, it is assumed that the heating step to establish the silicide reaction results in the formation of localized filaments 68 of the silicide layer 64 of either pure cobalt or cobalt silicide that penetrate below the pn junctions 54 of the source/drain regions 46 and 48.

Any unreacted metal remaining after the silicide reaction is removed by wet etching. For example, an HCl-peroxide dip with about a 3:1 ratio by volume, or an $H_2SO_4$-peroxide dip with about a 3:1 ratio by volume may be used.

A second anneal is performed to transform the silicide layer 64 into a final low ohmic phase. To eliminate the potentially troublesome filaments 68, the second anneal entails heating the substrate 42, and thus the silicide layer 64 and the filaments 68, above the agglomeration threshold temperature of the filaments 68 but below the agglomeration threshold temperature of the silicide layer 64. Heating the substrate 42, and thus the filaments 68, in this temperature range will cause the filaments 68 to break up into discrete spherical and spheroidal-like particles that cannot effectively short through the pn junctions 54. Since the agglomeration temperature of the bulk silicide layer 64 is not exceeded, the filaments 68 are eliminated without adversely affecting the structural integrity and sheet resistance of the silicide layer 64. The elimination of the filaments 68 through this thermal process leaves the silicide layer 64 positioned well above the pn junctions 54 of the source/drain regions 46 and 48 as shown in FIG. 3.

The agglomeration threshold temperature of a given structure, such as the filaments 68 and the bulk silicide layer 64, is largely a function of thickness. In general, relatively thicker structures have relatively higher agglomeration threshold temperatures. Since the thickness of the silicide layer 64 will normally be much greater than the thicknesses of the filaments 68, the agglomeration threshold temperature of the silicide layer 64 will be appreciably higher than that of the filaments 68.

The agglomeration threshold temperature for the filaments 68 may be determined by first experimentally determining the agglomeration threshold temperature of the silicide layer 64. A safety margin may then be subtracted from that temperature to yield an appropriate temperature for the second anneal that exceeds the agglomeration threshold of the filaments 68 but does not exceed the agglomeration threshold temperature of the bulk silicide layer 64. The agglomeration threshold temperature of the silicide layer 64 may be experimentally determined by, for example, performing the second anneal at several temperatures and measuring the sheet resistance of the silicide layer 64 after each run. A plot of anneal temperature versus sheet resistance may be examined to determine the temperature at which a significant rise in sheet resistance occurs. This point on the plot represents the temperature at which the silicide layer 64 undergoes agglomeration. An appropriate safety margin of, for example, about 10 to 20° may then be subtracted from this temperature to yield an appropriate temperature range for the second anneal. In an exemplary embodiment wherein the silicide layer 64 is composed substantially of cobalt silicide, the heating step may be performed at about 800 to 1000° C. for about 10 to 60 seconds in an RTA process.

Figure 6:
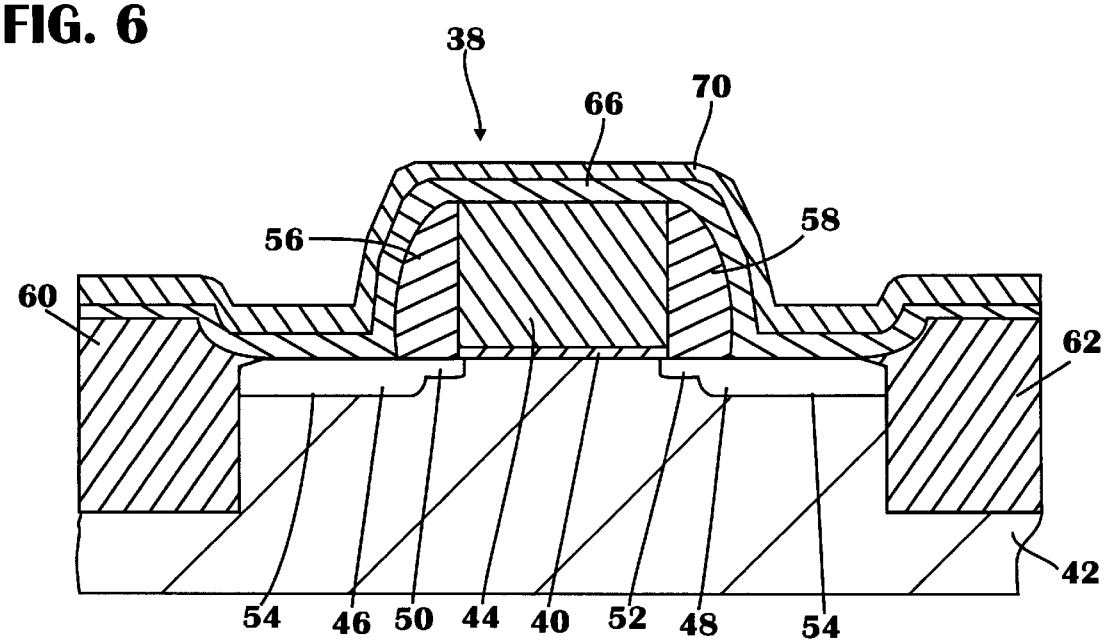
FIG. 6 is a cross-sectional view like FIG. 5 depicting an alternate exemplary process incorporating a gettering layer on the metal layer in accordance with the present invention.
Figure 7:
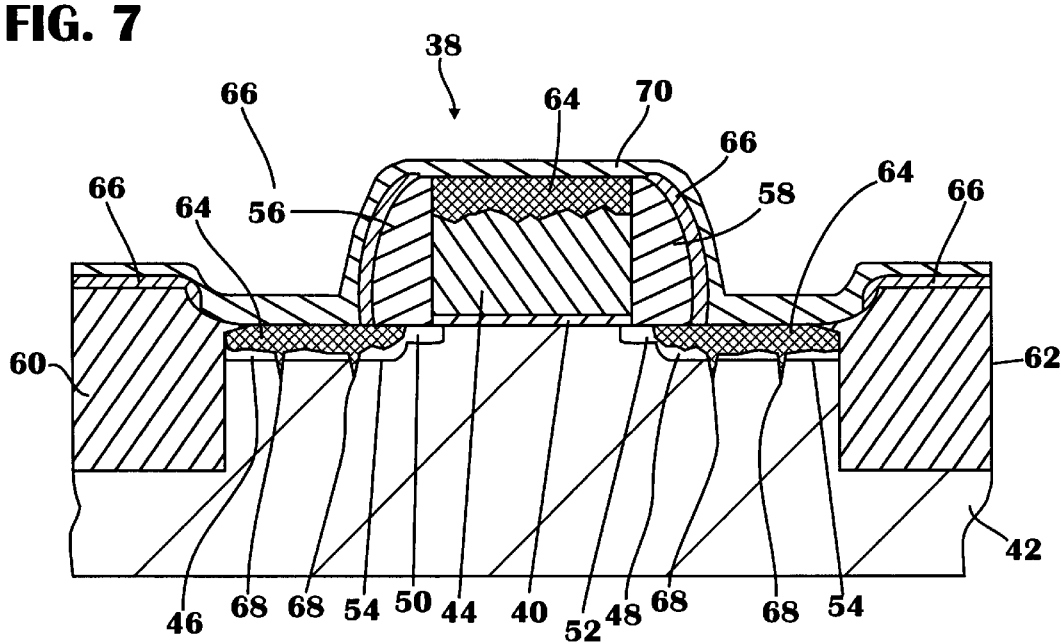
FIG. 7 is a cross-sectional view like FIG. 6 depicting thermal processing of the metal layer to establish a silicide layer in accordance with the present invention.

An alternate exemplary process of fabricating the transistor 38 and the silicide layer 64 in accordance with the present invention may be understood by referring now to FIGS. 4, 6 and 7. The substrate 42 may be processed may be processed as generally described above in conjunction with FIG. 4 to yield the transistor 38 and the overlying metal layer 66 as shown in as shown in FIG. 6. A layer 70 of material capable of gettering oxygen is next deposited on the metal layer 66. The layer 70 improves the overall sheet resistance of the subsequently formed silicide layer 64 by protecting the metal layer 66 from oxygen that may be present in the ambient during the subsequent silicide reaction. The layer 70 may be composed of a variety of materials capable of gettering oxygen, such as, for example, titanium, titanium nitride, molybdenum, chromium, tantalum, zirconium or the like and may be applied by PVD, sputter or the like. The thickness of the layer 70 may be about 50 to 100 Å.

Referring now to FIG. 7, the metal layer 66 may be reacted with the substrate 42 and the gate 44 as described above to establish the silicide layer 64. Any unreacted metal, such as the remaining portions of the metal layer 66 and the layer 70, may then be stripped using the aforementioned wet etch process. The second anneal may be performed as described above to yield the completed structure shown in FIG. 3.

The skilled artisan will appreciate that the process of the present invention enables reliable manufacture of cobalt silicide contact layers with narrow spacing between the cobalt silicide and the pn junctions of source/drain regions with reduced risk of reverse-bias diode-leakage currents due to filament formation. The alleviation of the potentially troublesome filaments and the ability to reduce the silicide to pn junction spacing can be capitalized in two ways. First, the depths of pn junctions for source/drain regions may be reduced, and thus the channel length of transistors may be scaled. Alternatively, the overall thickness of a given silicide layer on a source/drain region may be increased, and thus the overall sheet resistance and gate delay for the source/drain region may be reduced.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a first silicide layer on a first substrate having a pn junction, comprising the steps of:
   depositing a layer of metal on the first substrate;
   heating the metal layer and the first substrate to react the metal with the first substrate and form the first silicide layer;
   removing any unreacted metal;
   determining an agglomeration threshold temperature of the first silicide layer; and
   heating the first substrate and any filaments of the first silicide layer penetrating the pn junction above an agglomeration threshold temperature of the filaments but below the agglomeration threshold temperature of the silicide layer in order to avoid damaging the structural integrity of the first silicide layer.

2. The method of claim 1, wherein the metal comprises cobalt and the first silicide layer comprises cobalt silicide.

3. The method of claim 1, wherein the layer of metal is deposited on a transistor source/drain region.

4. The method of claim 1, wherein the metal layer is deposited by physical vapor deposition.

5. The method of claim 1, wherein the step of heating the metal layer and the first substrate comprises heating to about 400 to 600° C. for about 30 to 120 seconds.

6. The method of claim 1, wherein the step of heating the first substrate and any filaments of the silicide layer is performed at about 800 to 1000° C. for about 10 to 60 seconds.

7. The method of claim 1, comprising the step of etching the first substrate prior to depositing the metal layer to remove any native oxides.

8. The method of claim 1, comprising forming a layer of material capable of gettering oxygen on the metal layer prior to the step of heating the metal layer and the first substrate.

9. The method of claim 8, wherein the layer of material capable of gettering oxygen comprises titanium, titanium nitride, molybdenum, chromium, tantalum or zirconium.

10. The method of claim 1, wherein the step of determining an agglomeration threshold temperature of the first silicide layer comprises forming a second silicide layer that is substantially identical in thickness to the first siticide layer on a second substrate, performing a plurality of anneals at a plurality of temperatures on the second silicide layer, measuring the sheet resistance after each anneal, and determining the anneal temperature that produces an upward jump in sheet resistance from the anneal temperatures and measured sheet resistances.

11. A method of fabricating a first silicide layer on a gate electrode, a first source/drain region and a second source/drain region of a transistor on a first substrate, comprising the steps of:

depositing a layer of metal on the gate electrode and the first and second source/drain regions;

heating the metal layer, the gate electrode and the first and second source/drain regions to react the metal therewith and form the first silicide layer;

removing any unreacted metal;

determining an agglomeration threshold temperature of the first silicide layer; and heating the first substrate and any filaments of the first silicide layer penetrating the pn junctions of the first and second source/drain regions above an agglomeration threshold temperature of the filaments but below the agglomeration threshold temperature of the silicide layer in order to avoid damaging the structural integrity of the first silicide layer.

12. The method of claim 11, wherein the metal comprises cobalt and the first silicide layer comprises cobalt silicide.

13. The method of claim 11, wherein the layer of metal is deposited on a transistor source/drain region.

14. The method of claim 11, wherein the metal layer is deposited by physical vapor deposition.

15. The method of claim 11, wherein the step of heating the metal layer and the first substrate comprises heating to about 400 to 600° C. for about 30 to 120 seconds.

16. The method of claim 11, wherein the step of heating the first substrate and any filaments of the first silicide layer is performed at about 800 to 1000° C. for about 10 to 60 seconds.

17. The method of claim 11, comprising the step of etching the first substrate prior to depositing the metal layer to remove any native oxides.

18. The method of claim 11, comprising forming a layer of material capable of gettering oxygen on the metal layer prior to the step of heating the metal layer and the first substrate.

19. The method of claim 18, wherein the layer of material capable of gettering oxygen comprises titanium, titanium nitride, molybdenum, chromium, tantalum or zirconium.

20. The method of claim 11, wherein the step of determining an agglomeration threshold temperature of the first suicide layer comprises forming a second silicide layer that is substantially identical in thickness to the first silicide layer on a second substrate, performing a plurality of anneals at a plurality of temperatures on the second silicide layer, measuring the sheet resistance after each anneal, and determining the anneal temperature that produces an upward jump in sheet resistance from the anneal temperatures and measured sheet resistances.

21. A method of fabricating a first cobalt silicide layer on a first substrate having a pn junction, comprising the steps of:

depositing a layer of cobalt-containing material on the first substrate;

heating the layer of cobalt-containing material and the first substrate to react the layer of cobalt-containing material with the first substrate and form the first cobalt silicide layer;

removing any unreacted cobalt-containing material;

determining an agglomeration threshold temperature of the first silicide layer; and heating the first substrate and any filaments of the first cobalt silicide layer penetrating the pn junction above an agglomeration threshold temperature of the filaments but below the agglomeration threshold temperature of the silicide layer in order to avoid damaging the structural integrity of the first cobalt silicide layer.

22. The method of claim 21, wherein the cobalt-containing material comprises cobalt.

23. The method of claim 21, wherein the layer of cobalt-containing material is deposited on a transistor source/drain region.

24. The method of claim 21, wherein the layer of cobalt-containing material is deposited by physical vapor deposition.

25. The method of claim 21, wherein the step of heating the layer of cobalt-containing material and the first substrate comprises heating to about 400 to 600° C. for about 30 to 120 seconds.

26. The method of claim 21, wherein the step of heating the first substrate and any filaments of the first silicide layer above the agglomeration threshold temperature of the silicide layer is performed at about 800 to 1000° C. for about 10 to 60 seconds.

27. The method of claim 21, comprising the step of etching the first substrate prior to depositing the layer of cobalt-containing material to remove any native oxides.

28. The method of claim 21, comprising forming a layer of material capable of gettering oxygen on the layer of cobalt-containing material prior to the step of heating the layer of cobalt-containing material and the first substrate.

29. The method of claim 28, wherein the layer of material capable of gettering oxygen comprises titanium, titanium nitride, molybdenum, chromium, tantalum or zirconium.

30. The method of claim 21, wherein the step of determining an agglomeration threshold temperature of the first cobalt suicide layer comprises forming a second cobalt silicide layer that is substantially identical in thickness to the first cobalt silicide layer on a second substrate, performing a plurality of anneals at a plurality of temperatures on the second cobalt silicide layer, measuring the sheet resistance after each anneal, and determining the anneal temperature that produces an upward jump in sheet resistance from the anneal temperatures and measured sheet resistances.

31. A method of fabricating a transistor on a first substrate, comprising the steps of:

forming a gate insulating layer on the first substrate;

forming a gate electrode on the gate insulating layer;

forming a first source/drain region in the first substrate and a second source/drain region in the first substrate; and forming a first suicide layer on the first and second source/drain regions by depositing a layer of metal on the first and second source/drain regions, heating the metal layer and the substrate to react the metal with the first substrate and form the first silicide layer, removing any unreacted metal, determining al agglomeration threshold temperature of the first silicide layer, and heating the first substrate and any filaments of the first silicide layer penetrating the pn junctions of the first and second source/drain regions above an agglomeration threshold temperature of the filaments but below the agglomeration threshold temperature of the first silicide layer in order to avoid damaging the structural integrity of the first silicide layer.

32. The method of claim 31, wherein the metal comprises cobalt and the first silicide layer comprises cobalt silicide.

33. The method of claim 31, wherein the metal layer is deposited by physical vapor deposition.

34. The method of claim 31, wherein the step of heating the metal layer and the first substrate comprises heating to about 400 to 600° C. for about 30 to 120 seconds.

35. The method of claim 31, wherein the step of heating the first substrate and any filaments of the first silicide layer is performed at about 800 to 1000° C. for about 10 to 60 seconds.

36. The method of claim 31, comprising the step of etching the first substrate prior to depositing the metal layer to remove any native oxides.

37. The method of claim 31, comprising forming a layer of material capable of gettering oxygen on the metal layer prior to the step of heating the metal layer and the first substrate.

38. The method of claim 37, wherein the layer of material capable of gettering oxygen comprises titanium, titanium nitride, molybdenum, chromium, tantalum or zirconium.

39. The method of claim 31, wherein the step of determining an agglomeration threshold temperature of the first silicide layer comprises forming a second silicide layer that is substantially identical in thickness to the first silicide layer on a second substrate, performing a plurality of anneals at a plurality of temperatures on the second silicide layer, measuring the sheet resistance after each anneal, and determining the anneal temperature that produces an upward jump in sheet resistance from the anneal temperatures and measured sheet resistances.

* * * * *

UNITED STATES PATENT AND TRADEMARK OFFICE
CERTIFICATE OF CORRECTION

PATENT NO.   : 6,207,563 B1
DATED        : March 27, 2001
INVENTOR(S)  : Karsten Wieczorek et al.

It is certified that error appears in the above-identified patent and that said Letters Patent is hereby corrected as shown below:

Claim 6,
Line 2, insert -- first -- before "silicide";

Claim 10,
Line 4, delete "siticide" and substitute -- silicide -- therefor;

Claim 20,
Line 3, delete "suicide" and substitute -- silicide -- therefor;

Claim 21,
Line 1, insert -- first -- before "silicide";

Claim 26,
Line 2, insert -- cobalt -- between "first" and "silicide" and insert -- first cobalt -- between "the" and "silicide";

Claim 30,
Line 3, delete "suicide" and substitute -- silicide -- therefor; and

Column 11, claim 31,
Line 5, delete "suicide" and substitute -- silicide -- therefor, and delete "al" and substitute -- an -- therefor.

Signed and Sealed this

Eighteenth Day of December, 2001

*Attest:*

JAMES E. ROGAN
*Director of the United States Patent and Trademark Office*

*Attesting Officer*